(12) United States Patent
Gläser et al.

(10) Patent No.: US 6,184,695 B1
(45) Date of Patent: Feb. 6, 2001

(54) DIAGNOSTIC CIRCUIT FOR POTENTIOMETRIC SENSORS

(75) Inventors: Michael Gläser, Sprockhovel; Jürgen Bergmann, Herten, both of (DE)

(73) Assignee: Delphi Technologies, Inc., Troy, MI (US)

( * ) Notice: Under 35 U.S.C. 154(b), the term of this patent shall be extended for 0 days.

(21) Appl. No.: 09/190,795

(22) Filed: Nov. 12, 1998

(30) Foreign Application Priority Data

Nov. 20, 1997 (DE) .............................................. 197 51 556

(51) Int. Cl.[7] .................................................. G01R 27/08
(52) U.S. Cl. ............................................ 324/713; 324/723
(58) Field of Search ................................. 324/713, 714, 324/723

(56) References Cited

U.S. PATENT DOCUMENTS 5,049,827 * 9/1991 Tasma ..................................... 324/723
5,165,272 * 11/1992 Kleinhans et al. .................... 324/723

FOREIGN PATENT DOCUMENTS 3643945 6/1988 (DE) .
4116603 11/1992 (DE) .

* cited by examiner

Primary Examiner—Safet Metjahic
Assistant Examiner—James C Kerveros
(74) Attorney, Agent, or Firm—Richard A. Jones

(57) ABSTRACT

A diagnostic circuit (18) for a potentiometric sensor (10) having an electrically resistive means (12) and a sliding contact (14) in connection with the resistive means and providing an output from the sensor at a sensor output terminal (16), the diagnostic circuit comprising a low pass filter (36) connectable between the sliding contact and the sensor output terminal; alternating voltage supply means (20,21,22,24) having a high impedance connectable to the sliding contact; and amplitude modulation demodulating means (30,32,34) connectable between the sliding contact and a diagnostic output terminal (38), the voltage at the diagnostic output terminal providing an indication of the contact resistance between the sliding contact and the resistive means of the sensor. Monitors the contact resistance without interfering with the sensor output.

4 Claims, 1 Drawing Sheet

DIAGNOSTIC CIRCUIT FOR POTENTIOMETRIC SENSORS

TECHNICAL FIELD

The present invention relates to a diagnostic circuit for potentiometric sensors.

BACKGROUND OF THE INVENTION

A potentiometric sensor is used to detect and/or measure translational or rotational position (angles, fluid levels, distances, etc.). A potentiometric sensor is essentially a voltage divider comprising a sliding contact which engages a carbon film strip or other electrically resistive means, the resistive means being electrically connected to a supply voltage. The output voltage from the sensor is the voltage on the sliding contact or a proportion thereof. The position which is being detected or measured affects the position of the sliding contact relative to the resistive means, and so the value of the output voltage from the sensor can be used to provide an indication of the detected or measured position. A potential problem with such sensors is that a contact resistance may build up between the sliding contact and the resistive means, which, if undetected, can give rise to erroneous readings from the sensor.

SUMMARY OF THE INVENTION

It is an object of the present invention to provide a diagnostic circuit which can detect such a build up in the contact resistance between the sliding contact and the resistive means.

A diagnostic circuit in accordance with the present invention for a potentiometric sensor having an electrically resistive means and a sliding contact in connection with the resistive means and providing an output from the sensor at a sensor output terminal, comprises a low pass filter connectable between the sliding contact and the sensor output terminal; alternating voltage supply means having a high impedance connectable to the sliding contact; and amplitude modulation demodulating means connectable between the sliding contact and a diagnostic output terminal, the voltage at the diagnostic output terminal providing an indication of the contact resistance between the sliding contact and the resistive means of the sensor.

The present invention provides a diagnostic system for a potentiometric sensor which can detect any increase in contact resistance between the sliding contact and the resistive means without interfering with the output signal from the sensor, whilst the sensor is still operating. This allows appropriate steps to be taken before the sensor starts to provide inaccurate output signals.

BRIEF DESCRIPTION OF THE DRAWINGS

The present invention will now be described, by way of example, with reference to the accompanying drawing, in which.

DESCRIPTION OF THE PREFERRED EMBODIMENT

Figure 1:
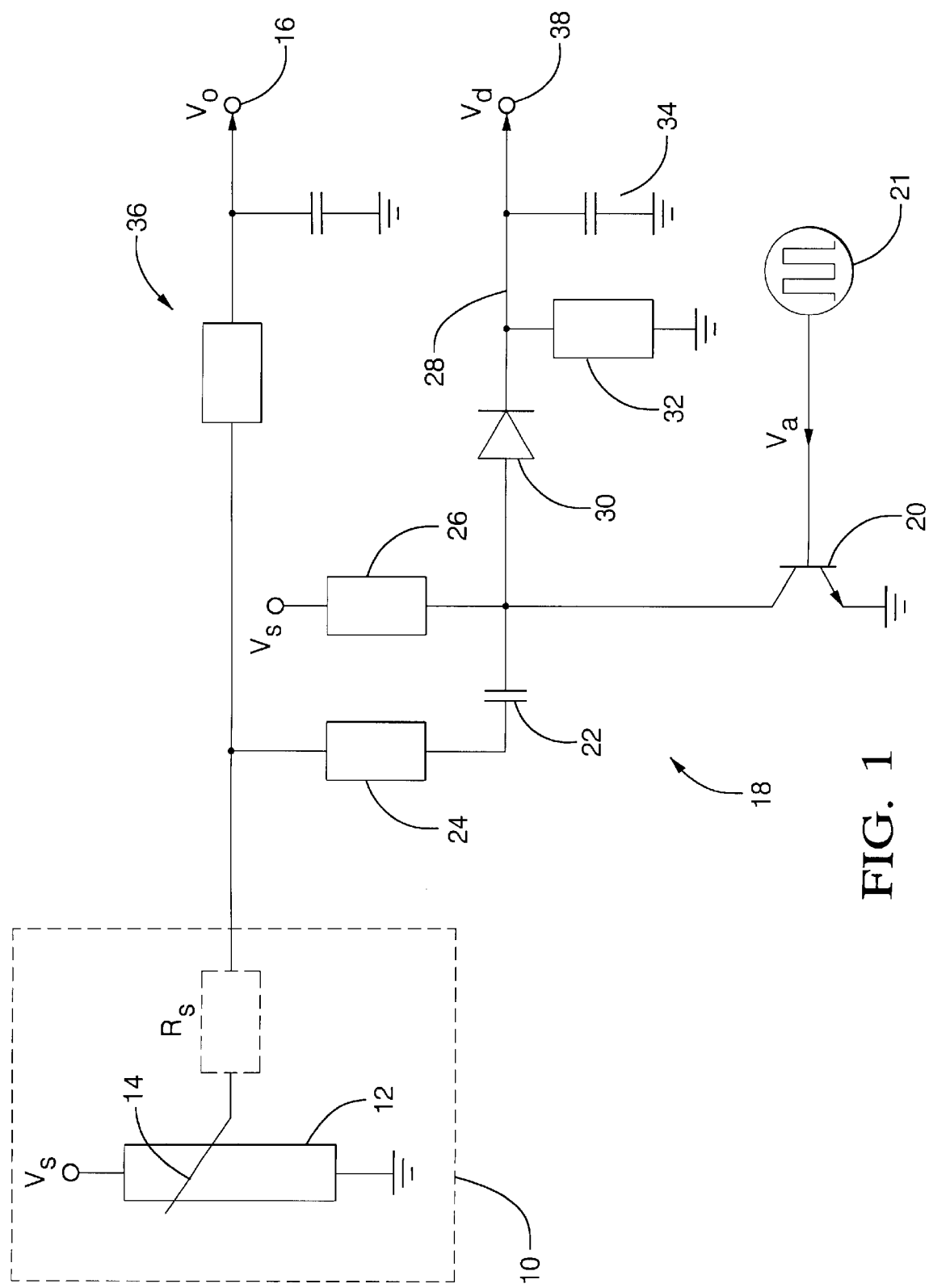
FIG. 1 is a circuit diagram of a diagnostic circuit in accordance with the present invention connected to a potentiometric sensor.

Referring to the drawing, a potentiometric sensor 10 comprises an electrically resistive means in the form of a carbon film strip 12 which is electrically connected between a supply voltage Vs and electrical ground, and a sliding contact 14 which makes an electrical connection with the carbon film strip. The sliding contact 14 is electrically connected to a sensor output terminal 16. The voltage Vo at the output terminal 16 is dependent on the position of the sliding contact 14 relative to the film strip 12. The position of the sliding contact 14 relative to the film strip 12 is dependent on the position which is being detected or measured by the sensor 10. Hence the output voltage Vo provides an indication of the position that is being detected or measured. The arrangement described so far is well known to those skilled in the art and will not be described in greater detail.

A diagnostic circuit 18 in accordance with the present invention is electrically connected between the output terminal 16 and the sliding contact 14. The diagnostic circuit 18 comprises switch means in the form of a transistor 20 which has a base receiving an alternating voltage Va from a suitable supply 21, an emitter connected to electrical ground, and a collector connected by way of a first capacitor 22 and a first resistor 24 to the line between the sliding contact 14 and the output terminal 16. The collector of the transistor 20 is also connected to the supply voltage Vs by way of a second resistor 26 and to an output line 28 from the diagnostic circuit 18 by way of a diode 30. A third resistor 32 and a second capacitor 34 are connected in parallel with one another between the output line 28 and electrical ground. The output line 28 terminates at a diagnostic output terminal 38. The diagnostic circuit 18 provides an interference signal on the line between the sliding contact 14 and the output terminal 16 of the sensor 10 which is filtered from the output voltage Vo from the sensor by a low pass filter 36 which comprises an RC circuit.

The values for the components of the diagnostic circuit 18 are selected such that when the electrical contact resistance between the sliding contact 14 and the film strip 12 is low, the output voltage Vd at the diagnostic output terminal 38 is significantly damped by the sensor 10. Such an arrangement is possible because the static resistance Rs of the sensor 10 is made higher than the dynamic resistance produced by the interference signal on the line between the sliding contact 14 and the output terminal 16. As the contact resistance rises, the damping effect lessens, and the output voltage Vd begins to rise. By monitoring the output voltage Vd on the diagnostic output terminal 38, any increase in contact resistance can be detected and steps taken to overcome the increase before inaccurate output voltages Vo are detected or measured at the output terminal 16 of the sensor 10.

In a preferred arrangement, where the supply voltage Vs is 5 v and the resistance of the film strip 12 is 2.2 k$\Omega$, the alternating voltage Va is preferably a square wave signal, and the preferred values for the components of the diagnostic circuit 18 are:

first capacitor 22—100 nF
first resistor 24—10 k$\Omega$
second resistor 26—56 k$\Omega$
third resistor 32—100 k$\Omega$
second capacitor 34—100 nF
RC circuit 36—resistor 100 k$\Omega$ and capacitor 100 nF.

The frequency of the alternating voltage Va is preferably higher than the frequency of the output voltage Vo from the sensor 10.

The present invention effectively comprises an alternating voltage supply means (20–24) having a high impedance which is connected to the sliding contact 14 of the sensor 10; a low pass filter 36 to filter out the alternating signal at the sensor output terminal 16; and demodulator means (30–34) which demodulates the amplitude modulation signal generated by the alternating voltage supply means in conjunction with the sensor 10 at the diagnostic output terminal 38. Although a specific arrangement of a diagnostic circuit in accordance with the present invention is described above, it will be appreciated that alternative arrangements could be used within the scope of the present invention to achieve the same effect. For example, some of the various components described above could be provided on an integrated circuit.

The present invention provides a diagnostic system for a potentiometric sensor which can detect any increase in contact resistance between the sliding contact and the resistive means without interfering with the output signal from the sensor whilst the sensor is operating.

What is claimed is:

1. A diagnostic circuit (18) for a potentiometric sensor (10) having an electrically resistive means (12) and a sliding contact (14) in connection with the resistive means and providing an output from the sensor at a sensor output terminal (16), the diagnostic circuit comprising a low pass filter (36) connectable between the sliding contact and the sensor output terminal; alternating voltage supply means (20,21,22,24) having a high impedance including an alternating voltage supply (21), a switch means (20) having an input electrically connected to the alternating voltage supply (21) and having an output, a first capacitor (22) and a first resistor (24) connected in series, electrically connectable with the sliding contact (14) and electrically connected to the output from the switch means (20); and amplitude modulation demodulating means (30,32,34) including a diode (30) connectable between the sliding contact and a diagnostic output terminal (38) and a second capacitor (34) and a third resistor (32) electrically connected in parallel to one another between the diagnostic output terminal (38) and electrical ground, the voltage at the diagnostic output terminal providing an indication of the contact resistance between the sliding contact and the resistive means of the sensor.

2. A diagnostic circuit as claimed in claim 1, wherein the alternating voltage supply (21) provides a square wave voltage (Va).

3. A diagnostic circuit as claimed in claim 2, wherein the switch means is a transistor (20) in which the base of the transistor defines the input of the switch means, the collector of the transistor defines the output of the switch means, and the emitter of the transistor is connected to electrical ground.

4. A diagnostic circuit as claimed in claim 3, wherein the collector is electrically connected, by way of a second resistor (26), to a supply voltage (Vs) connectable to the resistive means (12) of the sensor (10).

* * * * *